(12) United States Patent
Lee et al.

(10) Patent No.: US 6,381,187 B1
(45) Date of Patent: Apr. 30, 2002

(54) SENSE AMPLIFIER CIRCUIT FOR USE IN A SEMICONDUCTOR MEMORY DEVICE

(75) Inventors: Dong-Woo Lee, Seoul; Heung-Soo Im, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/671,465

(22) Filed: Sep. 27, 2000

(30) Foreign Application Priority Data

Sep. 30, 1999 (KR) .............................. 99-41976

(51) Int. Cl.[7] .................................................. G11C 7/00
(52) U.S. Cl. ........................ 365/207; 365/190; 365/210
(58) Field of Search ................................ 365/207, 210, 365/190

(56) References Cited

U.S. PATENT DOCUMENTS

| | | | | |
|---|---|---|---|---|
| 5,142,495 A | * | 8/1992 | Canepa | 365/210 |
| 5,355,333 A | * | 10/1994 | Pascucci | 365/210 |
| 5,381,374 A | * | 1/1995 | Shiraishi et al. | 365/210 |
| 5,627,790 A | * | 5/1997 | Golla et al. | 365/210 |

* cited by examiner

*Primary Examiner*—Tan T. Nguyen
(74) *Attorney, Agent, or Firm*—Marger Johnson & McCollom, P.C.

(57) ABSTRACT

Disclosed herein is a sense amplifier circuit which includes a first, a second and a third similar load transistors. The first and second load transistors supply a dummy data line with a current of the same amount to one another. Acting in a current mirror configuration, the third load transistor supplies a data line with a current equaling the total current supplied by the first and second load transistors. A dummy memory cell is composed of the same transistor as an on-state memory cell. According to this sense amplifier structure, it is very easy to obtain a dummy cell current which has an intermediate value consistently between an on cell current and an off cell current of the memory cell, which are supplied from the third load transistor to the data line. The improved intermediate value yields a reliable readout of the memory cell.

19 Claims, 3 Drawing Sheets

SENSE AMPLIFIER CIRCUIT FOR USE IN A SEMICONDUCTOR MEMORY DEVICE

CROSS REFERENCE TO RELATED APPLICATIONS

This application claims priority from Korean Priority Document No. 99-41976, filed on Sep. 30, 1999 with the Korean Industrial Property Office, which document is hereby incorporated by reference.

FIELD OF THE INVENTION

The present invention relates to semiconductor integrated circuit devices, and more particularly to a sense amplifier circuit of a semiconductor memory device.

BACKGROUND OF THE INVENTION

A conventional sense amplifier circuit used by a semiconductor memory device is illustrated in FIG. 1. The memory device includes a data line DL connected to a power supply voltage through a PMOS transistor MP2, an NMOS transistor MN2 which is switched by a column select signal Ysel, and a bit line BL connected to the data line DL through the NMOS transistor MN2. Between the bit line BL and the ground, only one memory cell transistor MC is depicted. However, it is obvious to ones skilled in the art that more memory cell transistors (not shown) can be connected therebetween.

The conventional sense amplifier includes a current mirror type differential amplifier 10, and a dummy data line DDL symmetrical to the data line DL. The dummy data line DDL is connected to a power supply voltage through a PMOS transistor MP1. It includes an on-state NMOS transistor MN1, a dummy bit line DBL coupled to the dummy data line DDL through an NMOS transistor MN1, and a dummy memory cell, which consists of dummy memory cell transistors DMC1 and DMC2 connected in series between the dummy bit line DBL and a ground. Herein, the NMOS transistor MN1 is used to provide the same RC loading as the NMOS transistor MN2 switched by the column select signal Ysel.

The PMOS transistors MP1 and MP2 constitute a current mirror so as to supply the data line DL and the dummy data line DDL with the same amount current to one another. An input IN1 of the differential amplifier 10 is coupled to the dummy data line DDL, and the other input IN2 thereof is coupled to the data line DL. The differential amplifier 10 detects a voltage difference between the data line DL and the dummy data line DDL to output a signal Sout of a logic low level or a logic high level as a detection result.

In FIG. 1, each dummy memory cell transistors DMC1 and DMC2 has the same size and characteristic as the on-state memory cell transistor MC, respectively. According to this structure, a current which flows through the dummy memory cell transistors DMC1 and DMC2 (hereinafter, referred to as a dummy cell current) corresponds to one-half of a current which flows through the on-state memory cell transistor MC (hereinafter, referred to as an on cell current). That is, the dummy cell current has an intermediate value of the on and off cell currents. Herein, if a current (hereinafter, referred to as an off cell current) flowing via an off-state memory cell MC is ideally '0', the dummy cell current corresponds to one-half of the on cell current. A diagram showing an ideal relationship between the on cell current, the off cell current, and the dummy cell current is illustrated in FIG. 2.

It can be seen in FIG. 2 that the dummy cell current is increased following the intermediate value of both the on cell current and the off cell current as the power supply voltage is increased. In a sense amplifier circuit designed according to such a current characteristic, a voltage of the dummy data line DDL corresponds to an intermediate voltage between a first voltage and a second voltage. The first voltage is a voltage induced on the data line DL when a memory cell MC is at the on state, and the second voltage is a voltage induced on the data line DL when the memory cell MC is at the off state. Therefore, a satisfactory sensing margin for the on-state memory cell transistor and the off-state memory cell transistor can be sufficiently secured.

In the conventional sense amplifier circuit, the dummy cell current which has the intermediate value of the on cell current (when the off cell current is '0') is obtained by connecting two dummy memory cell transistors in series, which have the same characteristic and size as the on-state memory cell transistor, respectively. But, it has proven very difficult to attain the theoretical ideal of FIG. 2. This is because generally, a current flowing via the memory cell transistor MC is a current which is obtained passing various elements such as a string select transistor, RC loading, or the like. The problem has been that the characteristics of the various elements can vary due to a number of factors, such as variations in processing, a different operating voltage, or a different operating temperature. This makes the dummy cell current be set less or more than the intermediate value of the on cell current, which generates a reduced on cell margin and off cell margin.

A frequent result is seen in FIG. 3. The dummy cell current is not in the middle of the on cell current and the off cell current curves. At some extreme values of small voltage, the dummy cell current isn't even between the curves. Accordingly, in the sense amplifier circuit scheme which generates the dummy cell current by using two serially-connected dummy memory cell transistors, the sensing margin for either the off-state memory cell transistor or the on-state memory cell transistor is reduced from what is illustrated in FIG. 2. And, in some extreme cases, it vanishes. Indeed, the dummy cell current can be even higher than the on cell current. That is, the voltage of the dummy data line DDL can be lower than the voltage of the data line DL when the memory cell is at the on state, or can be higher than the voltage of the data line DL when the memory cell is at the off state.

SUMMARY OF THE INVENTION

It is therefore an object of the present invention to provide a sense amplifier circuit capable of securing a stable on/off cell sensing margin.

It is another object of the invention to provide a sense amplifier circuit with a double load structure capable of easily obtaining a current which has an intermediate value between an on cell current and an off cell current.

In order to attain the above objects, according to an aspect of the present invention, there is provided a sense amplifier circuit for discriminating an on/off state of a memory cell transistor. The sense amplifier circuit comprises a data line, a dummy data line, first through third load transistors, and a differential amplifier. The data line is connected to the memory cell transistor, and the dummy data line is connected to a dummy memory cell transistor. The first and second load transistors are used for driving the dummy data line from the power supply voltage. Coupled as a current mirror, the third load transistor drives the data line from the power supply voltage at half the current, resulting from the 2:1 ratio of the current mirror. The differential amplifier receives signals from the data line and the dummy data lines, and then outputs either a logic low level or a logic high level according to a state of the memory cell transistor.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENTS

Preferred embodiments will be more fully described below with reference to the accompanying drawings.

Figure 1:
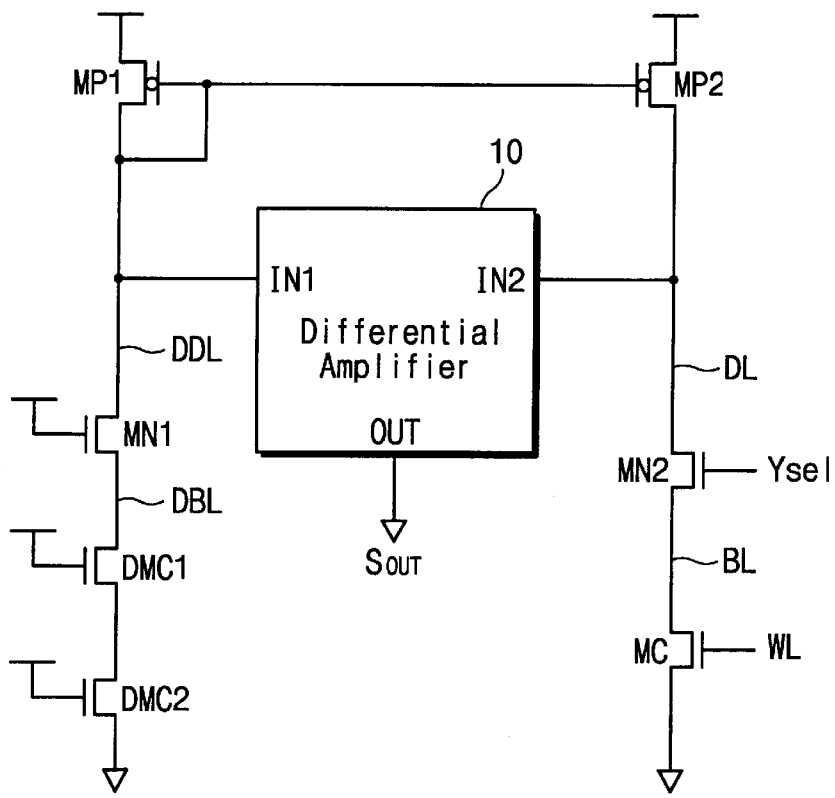
FIG. 1 is a circuit diagram showing a conventional sense amplifier circuit.
Figure 4:
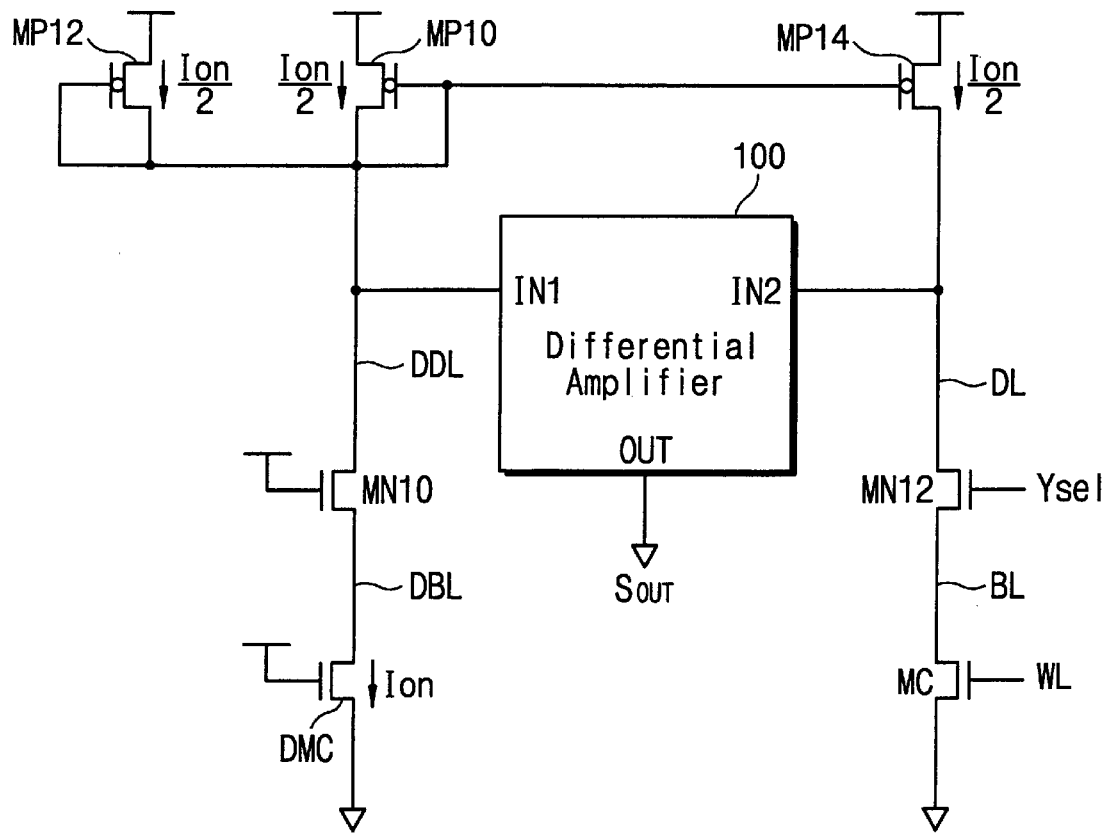
FIG. 4 is a preferred embodiment of a sense amplifier circuit according to the present invention.

FIG. 4 is a preferred embodiment of a sense amplifier circuit according to the present invention. In FIG. 4, some of the constituent elements are identical to those in FIG. 1, and are labeled with the same reference numeral. A data line DL connected to the power supply voltage via an PMOS transistor MP14 serves as a main load. An NMOS transistor MN12 is switched by a column select signal Ysel. A bit line BL is coupled to the data line DL via an NMOS transistor MN12. A memory cell transistor MC is connected between the bit line BL and the ground.

The sense amplifier circuit of the present invention comprises a current mirror type differential amplifier 100. A dummy data line DDL is connected to a power supply voltage via two PMOS transistors MP10 and MP12, which respectively operate as a dummy load. The circuit also includes an on-state NMOS transistor MN10, a dummy bit line DBL connected to the dummy data line DDL via the NMOS transistor MN10, and a dummy memory cell transistor DMC connected between the dummy bit line DBL and a ground. The differential amplifier 100 detects a voltage difference between the data line DL and the dummy data line DDL to output a signal Sout of either a logic low level or a logic high level according to a detection result.

In FIG. 4, the PMOS transistors MP10 and MP12 have the same size and characteristic as the PMOS transistor MP14, respectively, and is configured to have a double load scheme. The PMOS transistors MP10, MP12 and MP14, each serving as a load, constitute a current mirror. That is, the gates of the transistors MP10, MP12 and MP14 are commonly coupled to the dummy data line DDL as illustrated in FIG. 4.

The dummy memory cell transistor DMC can be implemented in a number of ways. When implemented as a transistor, it has the same size and characteristic as the memory cell transistor MC of an on state. That is, a dummy cell current which flows via the dummy memory cell transistor DMC corresponds to the on cell current. Below, the on cell current is labeled by a symbol "$I_{on}$". Since it has the same characteristic and size as the on-state memory cell transistor MC, the dummy memory cell transistor DMC discharges a dummy cell current which corresponds to the on cell current $I_{on}$. In this case, a current is supplied onto the dummy data line DDL which corresponds to the on cell current $I_{on}$ by means of the PMOS transistors MP10 and MP12 serving as a dummy load (or a current source), respectively. Since they have the same size and characteristic to each other, the respective PMOS transistors MP10 and MP12 supply the dummy data line DDL with a current $I_{on}/2$ which corresponds to one-half of the on cell current $I_{on}$. Summarily, the PMOS transistor MP14 serving as a main load supplies the data line DL with a current $I_{on}/2$ corresponding to one-half of the on cell current $I_{on}$ because it constitutes a current mirror with the PMOS transistors MP10 and MP12 and has the same size and characteristic as the transistors MP10 and MP12.

A charge current which flows from the power supply voltage to the dummy data line DDL via the PMOS transistors MP10 and MP12 decreases as a voltage of the dummy data line DDL increases. On the other hand, a discharge current which flows from the dummy data line DDL to the ground via the dummy memory cell transistor DMC increases as the voltage of the dummy data line DDL increases. Therefore, the voltage of the dummy data line DDL is determined by the balance between the charge current and the discharge current. A charge current flowing from the power supply voltage to the data line DL via the PMOS transistor MP14 decrease as a voltage of the data line DL increases.

When the memory cell transistor MC is at an on state, the on cell current $I_{on}$ is discharged therethrough which is more than a charge current $I_{on}/2$ supplied into the data line DL from the power supply voltage via the PMOS transistor MP14. Therefore, a voltage of the data line DL is less than a voltage of the dummy data line DDL. On the other hand, when the memory cell transistor MC is at an off state, a charge current which is supplied to the data line DL from the power supply voltage via the PMOS transistor MP14 is increasingly charged. Therefore, the voltage of the data line DL is more than the voltage of the dummy data line DDL. A difference between the voltage of the data line DL and the voltage of the dummy data line DDL is detected by the differential amplifier 100.

In case of the conventional sense amplifier structure, by using a dummy cell current which is obtained by two serially-connected dummy memory cell transistors, to the data line DL supplied is a current corresponding to the dummy cell current. In such a sense amplifier structure, it is very difficult to get a dummy cell current having an intermediate value of the on cell current and the off cell current, because of considering all of the above-described various elements.

Figure 3:
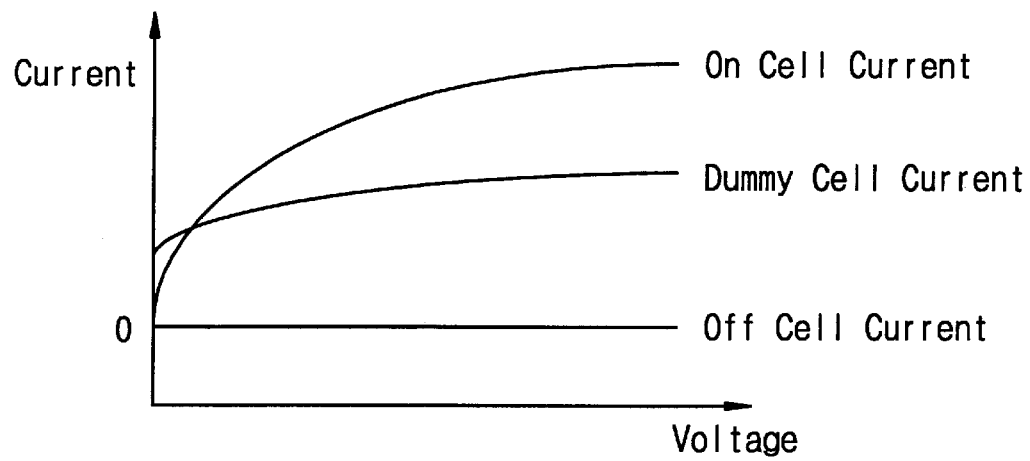
FIG. 3 is a diagram showing a real life behavior of a dummy cell current relative to an on cell current and an off cell current in the circuit of FIG. 1.

In accordance with the sense amplifier structure of the present invention, however, a dummy memory cell is realized using only an on-state memory cell transistor, and a dummy load for supplying a dummy data line with a charge current is realized using the above-mentioned double load structure. Therefore, it is very easy to get a charge current which has an intermediate value of the on cell current and the off cell current and which is to be supplied to the data line DL. As a result, it is prevented (or minimized) not only an inversion appearance between the dummy cell current and the on/off cell current (refer to FIG. 3), but also a reduction of an on/off cell margin. That is, a stable on/off cell sensing margin can be secured.

Figure 2:
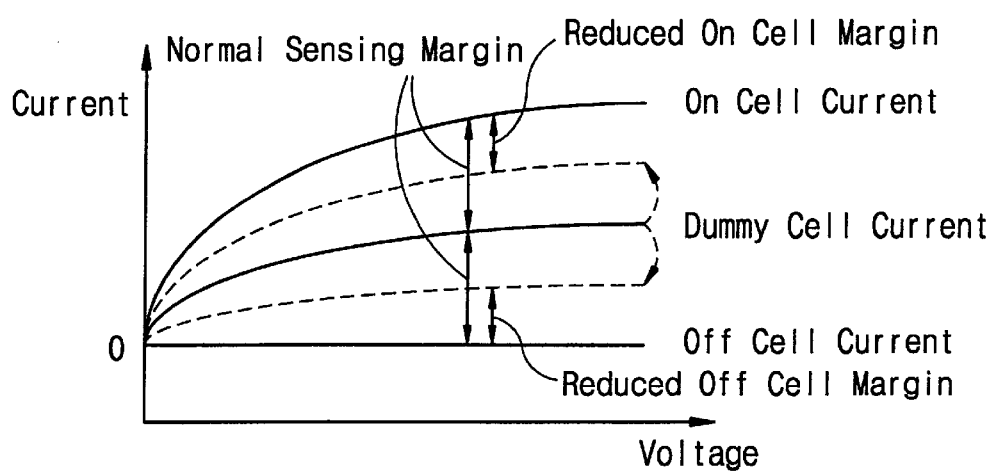
FIG. 2 is a diagram showing a theoretically ideal relationship of a dummy cell current between an on cell current and an off cell current of a circuit according to FIG. 1.

The present invention operates by making the current mirror not be a 1:1 mirror, but a different ratio. To achieve the ideal behavior of FIG. 2, a ratio of 2:1 is preferred. This ratio can be accomplished with the three shown similar PMOS transistors. Although not shown in the figures, it is obvious to ones skilled in the art that the dummy load (composed of two PMOS transistors) can be realized by use of a single PMOS transistor to supply the on cell current. The single transistor has a different characteristic, such as different size, etc., as is known in the art of current mirrors. In addition, what is accomplished with PMOS transistors can be accomplished with NMOS transistors, etc.

It will be appreciated that the invention permits other efficiencies. Specifically, the differential amplifier 100 of FIG. 4 need not have an input from dummy data line DDL. The 2:1 current mirror generates such a stable dummy cell current characteristic, that only the data line needs to be sensed. This can be accomplished with a buffer for outputting a detection result corresponding to a voltage sensed on the data line.

Figure 5:
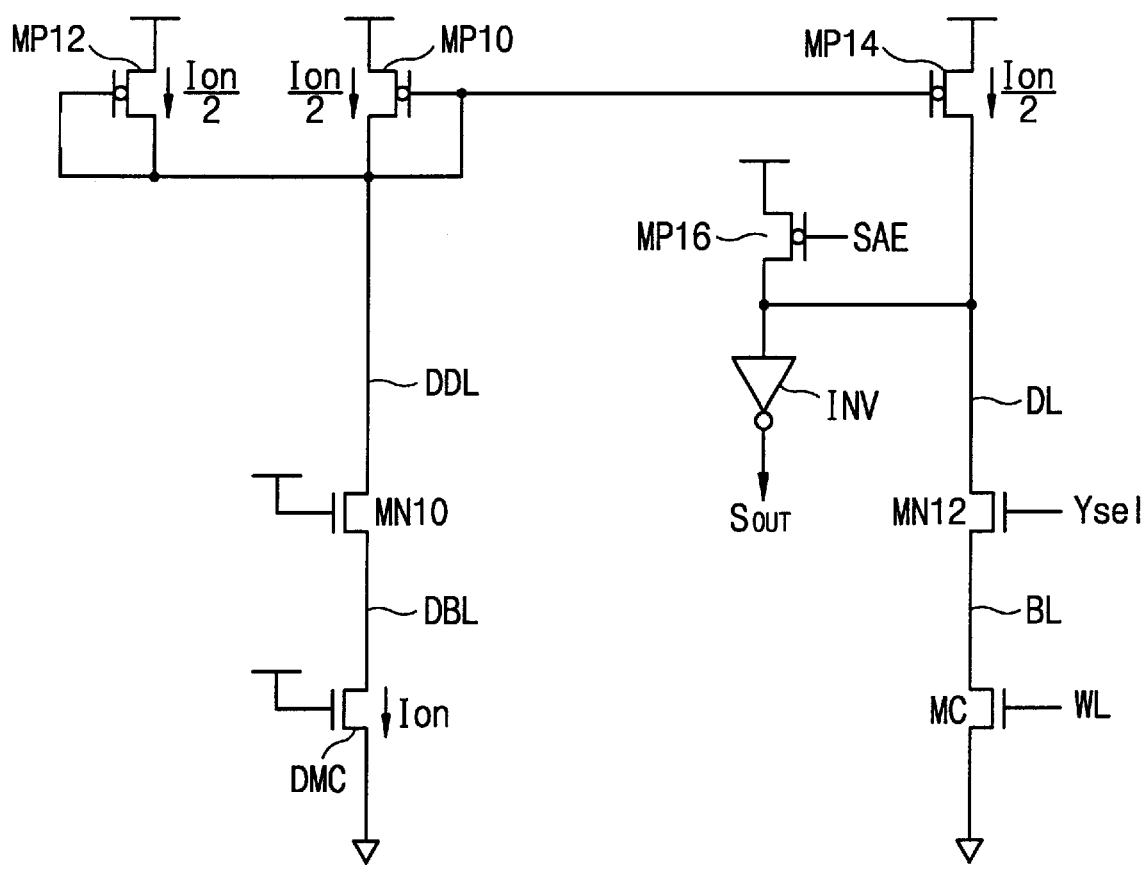
FIG. 5 is a modified embodiment of a sense amplifier circuit according to the present invention.

FIG. 5 is a modified embodiment of the sense amplifier circuit according to the present invention. In FIG. 5, the constituent elements that are identical to those in FIG. 4 are labeled with the same reference numeral, and description thereof is thus omitted. It is obvious to ones skilled in the art that the sense amplifier circuit of FIG. 5 has the same effect as that of FIG. 4.

The sense amplifier circuit of FIG. 5 is identical to that of FIG. 4, except that the differential amplifier is replaced with an inverter INV1 and a PMOS transistor MP16 is added therein. The inverter INV1 is a buffer for detecting a voltage level of the data line DL according to an on/off state of the memory cell transistor MC. The PMOS transistor MP16 is switched by a sense amplification enable signal SAE, which can be activated high only during a sensing operation. Importantly, inverter INV need not receive any input from the dummy data line DDL.

It is to be noted that while the preferred embodiments as described above relate to a sense amplifier circuit for a mask ROM, the present invention shall not be so limited and can be applied to a wide range of semiconductor memory devices wherein each memory cell includes one MOS transistor of such devices as EPROM and EEPROM devices.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A sense amplifier circuit for reading a logic state of a memory cell comprising:
   a first data line coupled to the memory cell;
   a second data line coupled to a dummy memory cell, wherein the dummy memory cell is comprised of only one memory cell at an on state;
   a first load coupled to the first data line, for supplying the first data line with a first charge current; and
   a second load coupled to the second data line, for supplying the second data line with a second charge current which is different from the first charge current.

2. A sense amplifier circuit for reading a logic state of a memory cell comprising:
   a first data line coupled to the memory cell;
   a second data line couples to a dummy memory cell;
   a second data line coupled to a dummy memory cell;
   a first load coupled to the first data line, for supplying the first data line with a first charge current; and
   a second load coupled to the second data line, for supplying the second data line with a second charge current which is different from the first charge current,
   wherein the first charge current corresponds to one-half of a current discharged via the memory cell which is being read in the on-state.

3. A sense amplifier circuit for reading a logic state of a memory cell comprising:
   a first data line coupled to the memory cell;
   a second data line coupled to a dummy memory cell;
   a first load coupled to the first data line, for supplying the first data line with a first charge current; and
   a second load coupled to the second data line, for supplying the second data line with a second charge current which is different from the first charge current,
   wherein the first load comprises a first PMOS transistor connected to the first data line, for supplying the first data line with the first charge current in response to a voltage on the second data line.

4. The sense amplifier circuit according to claim 3, wherein the second load comprises second and third PMOS transistors.

5. The sense amplifier circuit according to claim 4, wherein the first, second and third PMOS transistors have their gates connected commonly to the second data line so as to constitute a current mirror.

6. The sense amplifier circuit according to claim 5, wherein the first, second and third PMOS transistors are similar.

7. The sense amplifier circuit according to claim 3, wherein the second load comprises a second PMOS transistor coupled to the second data line for supplying the second data line with the second current, wherein gates of the first and second PMOS transistors commonly coupled to the second data line so as to constitute a current mirror.

8. A sense amplifier circuit for reading a logic state of a memory cell comprising:
   a first data line coupled to the memory cell;
   a second data line coupled to a dummy memory cell;
   a first load coupled to the first data line, for supplying the first data line with a first charge current;
   a second load coupled to the second data line, for supplying the second data line with a second charge current which is different from the first charge current; and
   a buffer for outputting a detection result corresponding to a voltage sensed on the first data line.

9. The sense amplifier circuit according to claim 8, wherein the buffer includes an inverter having an input terminal coupled to the first data line, and an output terminal for outputting the detection result.

10. The sense amplifier circuit according to claim 9, further comprising a transistor coupled between a power supply voltage and the input of the inverter, the transistor having a gate coupled to receive a sense amplification enable signal.

11. A sense amplifier circuit for discriminating an on/off state of a memory cell transistor comprising:
   a data line connected to the memory cell transistor;
   a dummy data line connected to a dummy memory cell transistor;

a first load transistor having its gate and drain commonly coupled to the dummy data line, and its source coupled to a power supply voltage;

a second load transistor having its gate and drain commonly coupled to the dummy data line, and its source coupled to the power supply voltage; and a third load transistor having its gate coupled to the dummy data line, its source coupled to the power supply voltage, and its drain coupled to the data line.

12. The sense amplifier circuit according to claim 11, wherein the first, second and third load transistors have the same size.

13. The sense amplifier circuit according to claim 12, wherein the dummy memory cell transistor is comprised of only one memory cell transistor at an on state.

14. The sense amplifier circuit according to claim 11, wherein each of the first, second and third load transistors flow a current corresponding to one-half of an on cell current discharged via the memory cell transistor while at an on-state.

15. The sense amplifier circuit according to claim 11, further comprising a buffer for outputting a detection result corresponding to a voltage sensed on the data line.

16. The sense amplifier circuit according to claim 15, wherein the buffer includes an inverter having an input terminal coupled to the first data line, and an output terminal for outputting the detection result.

17. The sense amplifier circuit according to claim 16, further comprising a PMOS transistor having a source coupled to a power supply voltage, a drain coupled to the data line and a gate coupled to receive a sense amplification enable signal.

18. A sense amplifier circuit for discriminating an on/off state of a memory cell transistor comprising:

a data line connected to the memory cell transistor;

a dummy data line connected to a dummy memory cell transistor;

a first load transistor having its gate and drain commonly coupled to the dummy data line, and its source coupled to a power supply voltage, for providing a first charge current to the dummy data line; and a second load transistor having its gate coupled to the dummy data line, and its source coupled to the power supply voltage, and its drain coupled to the data line for providing a second charge current to the data line, wherein the second load transistor is different from the first load transistor, the second charge current thereby being different than the first charge current.

19. The sense amplifier circuit according to claim 18, wherein the second load transistor is different from the first load transistor in such a way that the second charge current is approximately half the first charge current.

* * * * *

UNITED STATES PATENT AND TRADEMARK OFFICE
CERTIFICATE OF CORRECTION

PATENT NO. : 6,381,187 B1 Page 1 of 1
DATED : April 30, 2002
INVENTOR(S) : Lee et al.

It is certified that error appears in the above-identified patent and that said Letters Patent is hereby corrected as shown below:

Column 4,
Line 46, "In case" should read -- In the case --.
Lines 48-50, "to the data line DL supplied is a current corresponding to the dummy cell current." should read -- a current corresponding to the dummy cell current is supplied to the data line DL. --.

Column 5,
Line 36, "INV" should read -- INV1 --.

Column 6,
Lines 1-2, "a second data line couples to a dummy memory cell; a second data line coupled to a dummy memory cell;" should read -- a second data line couples to a dummy memory cell; --

Signed and Sealed this

Fifth Day of November, 2002

Attest:

Attesting Officer

JAMES E. ROGAN
Director of the United States Patent and Trademark Office